United States Patent
Kim et al.

(10) Patent No.: US 11,327,911 B2
(45) Date of Patent: May 10, 2022

(54) OUTPUT CONTROL CIRCUIT AND SEMICONDUCTOR APPARATUS INCLUDING THE SAME

(71) Applicant: SK hynix Inc., Icheon-si (KR)

(72) Inventors: Kyu Young Kim, Icheon-si (KR); Dae Han Kwon, Icheon-si (KR); Ha Jun Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/855,566

(22) Filed: Apr. 22, 2020

(65) Prior Publication Data

US 2021/0117349 A1    Apr. 22, 2021

(30) Foreign Application Priority Data

Oct. 16, 2019   (KR) .................. 10-2019-0128268

(51) Int. Cl.
  *G11C 7/22*    (2006.01)
  *G06F 13/20*   (2006.01)
  *G11C 7/10*    (2006.01)

(52) U.S. Cl.
  CPC ............ *G06F 13/20* (2013.01); *G11C 7/1012* (2013.01); *G11C 7/1051* (2013.01); *G11C 7/22* (2013.01)

(58) Field of Classification Search
  None
  See application file for complete search history.

(56) References Cited

U.S. PATENT DOCUMENTS

| | | | | |
|---|---|---|---|---|
| 5,524,237 A * | 6/1996 | Bestler | .................. | G06F 13/405 709/237 |
| 7,701,267 B2 * | 4/2010 | Yoon | .................... | H03L 7/0814 327/147 |
| 7,952,388 B1 * | 5/2011 | Song | .............. | H03K 19/018528 326/68 |
| 8,243,543 B2 * | 8/2012 | Shin | ..................... | G11C 7/1006 365/219 |
| 8,629,985 B2 * | 1/2014 | Nakata | ............... | G01B 9/02076 356/498 |
| 10,348,536 B2 * | 7/2019 | Choi | .................. | H04B 10/5167 |
| 2018/0017033 A1 * | 1/2018 | Miyazawa | ........... | H03K 17/042 |
| 2019/0172510 A1 * | 6/2019 | Kim | ........................ | G11C 7/1093 |
| 2020/0133505 A1 * | 4/2020 | Kim | ....................... | G11C 29/023 |
| 2020/0310988 A1 * | 10/2020 | Keepers | .................. | G06F 21/79 |

\* cited by examiner

*Primary Examiner* — Elias Mamo
(74) *Attorney, Agent, or Firm* — William Park & Associates Ltd.

(57) ABSTRACT

A semiconductor apparatus may include a data output path connected to a data input/output pad and configured to output read data according to a read command, and at least one circuit configuration included in the data output path may perform a pre-toggling operation of toggling its own output signal at least once in an interval between a time point at which the read command has been generated and a time point at which the read data is outputted through the data output path.

17 Claims, 7 Drawing Sheets

OUTPUT CONTROL CIRCUIT AND SEMICONDUCTOR APPARATUS INCLUDING THE SAME

CROSS-REFERENCES TO RELATED APPLICATION

The present application claims priority under 35 U.S.C. § 119(a) to Korean application number 10-2019-0128268, filed on Oct. 16, 2019, in the Korean Intellectual Property Office, which is incorporated herein by reference in its entirety.

BACKGROUND

1. Technical Field

Various embodiments generally relate to a semiconductor circuit, and more particularly, to an output control circuit and a semiconductor apparatus including the same.

2. Related Art

As an operation speed of a semiconductor apparatus increases, data output characteristics of the semiconductor apparatus deteriorate due to an unstable voltage level of a data output path during a read operation, that is, a data output operation.

SUMMARY

In an embodiment, a semiconductor apparatus may include a data output path connected to a data input/output pad and configured to output read data according to a read command, wherein at least one circuit configuration included in the data output path may perform a pre-toggling operation of toggling its own output signal at least once in an interval between a time point at which the read command has been generated and a time point at which the read data is outputted through the data output path.

In an embodiment, an output control circuit may include a data input/output pad and a data output path connected to the data input/output pad. The output control circuit may perform a pre-toggling operation of toggling an output signal of at least one of circuit configurations of the data output path at a time before data output through the data input/output pad is performed, in a state in which a voltage level of the data input/output pad has been fixed.

In an embodiment, a semiconductor apparatus may include a main driver configured to output read data, which is generated by driving an input signal, to a data input/output pad and to fix a voltage level of the read data according to a data output off signal. The semiconductor apparatus may also include a multiplexing circuit configured to multiplex data to provide multiplexed data as the input signal of the main driver, and to perform a pre-toggling operation on the input signal of the main driver according to a corrected data output off signal generated according to the data output off signal. The pre-toggling operation may be an operation of toggling the input signal of the main driver at least once in an interval between a time point at which a read command has been generated and a time point at which the read data is outputted.

DETAILED DESCRIPTION

Hereinafter, an output control circuit and a semiconductor apparatus including the same will be described in more detail with reference to the accompanying drawings. An output control circuit capable of improving data output characteristics and a semiconductor apparatus including the same are described herein.

Figure 1:
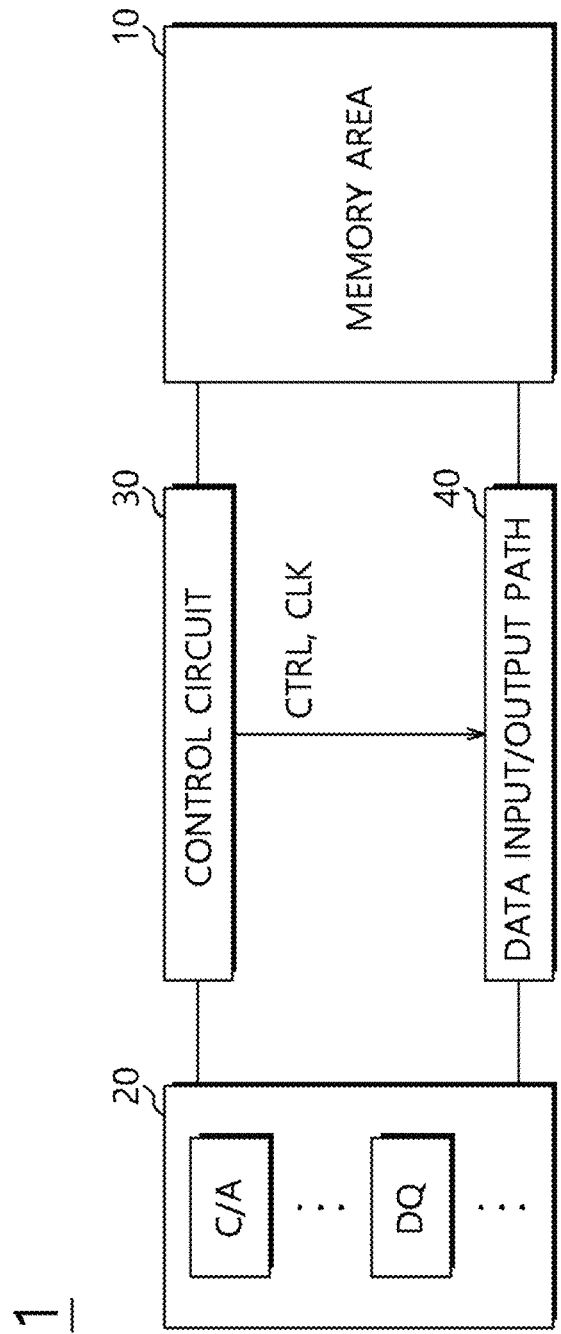
FIG. 1 is a diagram illustrating a configuration of a semiconductor apparatus in accordance with an embodiment.

FIG. 1 is a diagram illustrating a configuration of a semiconductor apparatus 1 in accordance with an embodiment.

Referring to FIG. 1, the semiconductor apparatus 1 may include a memory area 10, an input/output terminal 20, a control circuit 30, and a data input/output path 40.

The memory area 10 may include a volatile memory and/or a nonvolatile memory.

The volatile memory may include a static RAM (SRAM), a dynamic RAM (DRAM), and a synchronous DRAM (SDRAM).

The nonvolatile memory may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM), and the like.

The input/output terminal 20 may include command and address pads C/A and data input/output pads DQ.

The control circuit 30 may receive an external clock signal CLK through the input/output terminal 20, and provide the received external clock signal CLK to the other components in the semiconductor apparatus 1.

The control circuit 30 may generate control signals CTRL related to data input/output.

An external device may be a host device such as a central processing unit (CPU), a graphics processing unit (GPU), a multimedia processor (MMP), a digital signal processor (DSP), an application processor (AP), and a memory controller. Furthermore, the external device may be a test device for testing the semiconductor apparatus 1.

The control circuit 30 may include a decoder for decoding commands and addresses inputted through the command and address pads C/A, a mode register set for setting various operation modes including a test mode, and control logics.

The data input/output path 40 may include a data output path 41 composed of circuits through which data passes from the memory area 10 to the input/output terminal 20 and a data input path 42 composed of circuits through which data passes from the input/output terminal 20 to the memory area 10.

The data output path 41 in accordance with the embodiment may pre-toggle an output signal of a path before the data input/output pads DQ at a timing before data output is performed through the data input/output pads DQ of the input/output terminal 20.

The pre-toggling may be performed in either a pattern of repeating low-high level intervals or a pattern of repeating high-low level intervals.

The low level interval may indicate an interval in which a logic value is '0' and the high level interval may indicate an interval in which a logic value is '1.'

In the embodiment, voltage levels of the data input/output pads DQ may be substantially maintained at a predetermined level, regardless of the pre-toggling operation, during the pre-toggling operation interval.

Figure 2:
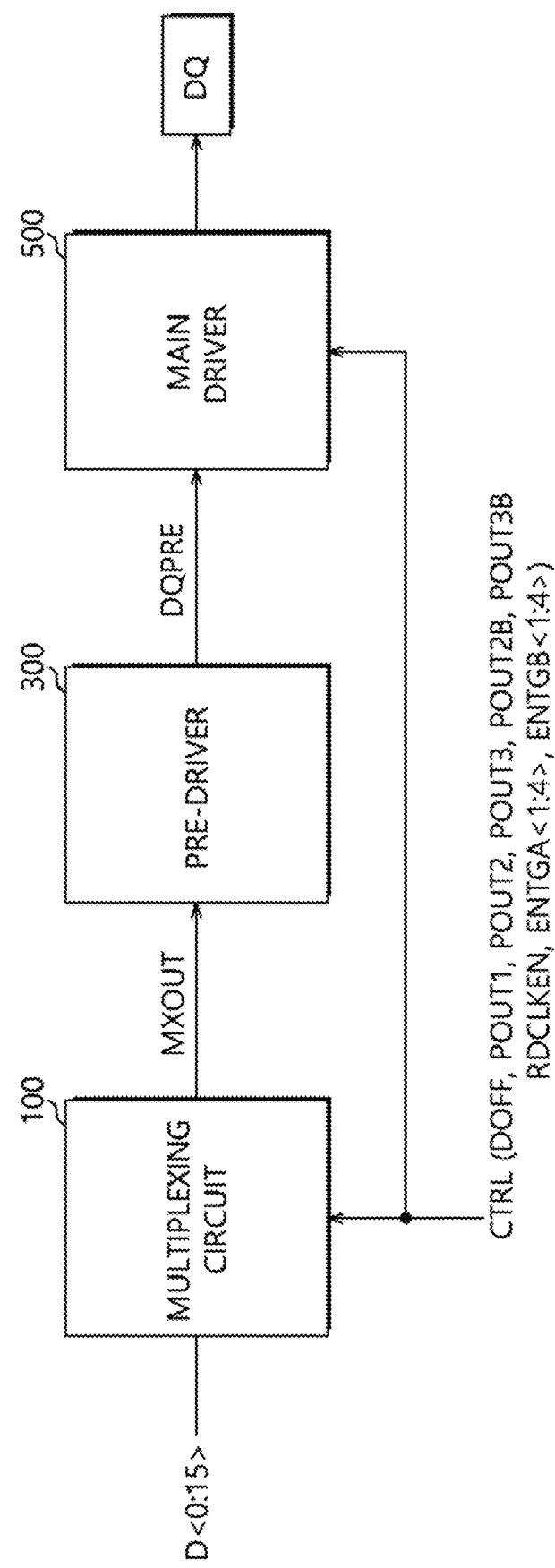
FIG. 2 is a diagram illustrating a configuration of a data output path of FIG. 1.

FIG. 2 is a diagram illustrating a configuration of the data output path 41 of FIG. 1.

Referring to FIG. 2, the data output path 41 of FIG. 1 may include a multiplexing circuit 100, a pre-driver 300, and a main driver 500.

The multiplexing circuit 100 may generate multiplexed data MXOUT by multiplexing data D<0:15>, which is outputted from the memory area 10, according to the control signal CTRL.

The control signal CTRL may include a plurality of signals, for example, DOFF, POUT1B, POUT3, POUT3B, POUT2, POUT2B, RDCLKEN, ENTGA<1:4>, and ENTGB<1:4>.

The POUT1B, the POUT3, the POUT3B, the POUT2, and the POUT2B may be internal clock signals.

The internal clock signals POUT1B, POUT3, POUT3B, POUT2, POUT2B may be generated by dividing (for example, 8-dividing) the external clock signal CLK to be described with reference to FIG. 3.

The POUT1B may be generated at the earliest timing, and the POUT3, the POUT3B, the POUT2, and the POUT2B may be generated at a predetermined timing based on the POUT1B.

The POUT3B may have a phase opposite to the POUT3 and the POUT2B may have a phase opposite to the POUT2.

The DOFF may be used as a data output off signal.

The RDCLKEN may be used as a clock enable signal for controlling the activation of the POUT1B, the POUT3, the POUT3B, the POUT2, and the POUT2B.

Figure 3:
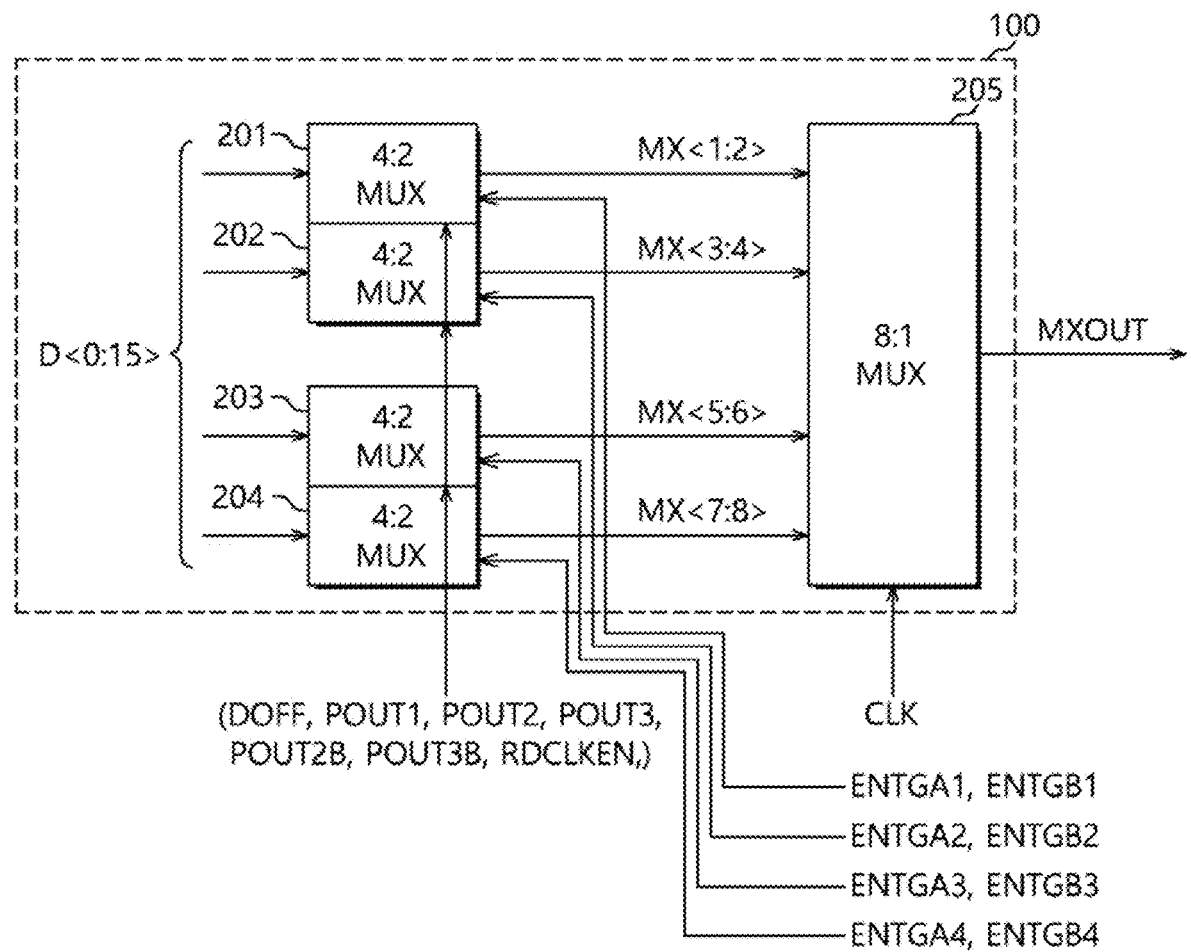
FIG. 3 is a diagram illustrating a configuration of a multiplexing circuit of FIG. 2.

The ENTGA<1:4> and the ENTGB<1:4> may be used as signals for controlling pre-toggling operations of first to fourth multiplexers 201 to 204 of FIG. 3.

The ENTGA1 and the ENTGB1 are signals for controlling the pre-toggling operation of the first multiplexer 201 and will be hereinafter referred to as first pre-toggling control signals.

The ENTGA2 and the ENTGB2 are signals for controlling the pre-toggling operation of the second multiplexer 202 and will be hereinafter referred to as second pre-toggling control signals.

The ENTGA3 and the ENTGB3 are signals for controlling the pre-toggling operation of the third multiplexer 203 and will be hereinafter referred to as third pre-toggling control signals.

The ENTGA4 and the ENTGB4 are signals for controlling the pre-toggling operation of the fourth multiplexer 204 and will be hereinafter referred to as fourth pre-toggling control signals.

The first to fourth pre-toggling control signals ENTGA<1:4> and the ENTGB<1:4> may be set to desired values through the mode register set of the control circuit 30.

The pre-driver 300 may generate preliminary read data DQPRE by driving the multiplexed data MXOUT.

The main driver 500 may output read data, which is generated by driving the preliminary read data DQPRE, through the data input/output pads DQ.

The main driver 500 may fix a level of the read data to a predetermined level, regardless of a level of the preliminary read data DQPRE, according to the control signal CTRL.

The embodiment is an example of pre-toggling an output level of at least one of circuits prior to a final circuit configuration directly connected to the data input/output pads DQ among circuit configurations constituting the data output path 41.

The voltage levels of the data input/output pads DQ may be substantially maintained at a predetermined level regardless of the pre-toggling operation while the output level of at least one of the circuits prior to the final circuit configuration directly connected to the data input/output pads DQ is being pre-toggled.

FIG. 3 is a diagram illustrating a configuration of the multiplexing circuit 100 of FIG. 2.

Referring to FIG. 3, the multiplexing circuit 100 may include a plurality of preliminary multiplexers and a main multiplexer.

The plurality of preliminary multiplexers may multiplex some data bits, which are inputted thereto, according to the control signal CTRL, and output the multiplexed data bits.

Among the plurality of preliminary multiplexers, output levels of some preliminary multiplexers and output levels of the remaining preliminary multiplexers may be differently set according to the control signal CTRL.

The main multiplexer may multiplex and output the output of the plurality of preliminary multiplexers.

The main multiplexer may allow its own output signal to have a pre-toggling interval according to the output signals of the plurality of preliminary multiplexers.

The plurality of preliminary multiplexers may include the first to fourth multiplexers 201 to 204.

The main multiplexer may include a fifth multiplexer 205.

The first to fourth multiplexers 201 to 204 may be configured identically to one another.

Each of the first to fourth multiplexers 201 to 204 may multiplex some data bits of the data D<0:15>, which are inputted thereto, according to the control signal CTRL, and output the multiplexed data bits.

The first to fourth multiplexers 201 to 204 may receive the DOFF, the POUT1B, the POUT3, the POUT3B, the POUT2, the POUT2B, and the RDCLKEN in common among the control signals CTRL.

Among the control signals CTRL, the ENTGA1 and the ENTGB1 may be inputted to the first multiplexer 201, the ENTGA2 and the ENTGB2 may be inputted to the second multiplexer 202, the ENTGA3 and the ENTGB3 may be inputted to the third multiplexer 203, and the ENTGA4 and the ENTGB4 may be inputted to the fourth multiplexer 204.

The first to fourth multiplexers 201 to 204 may be configured identically to one another.

Each of the first to fourth multiplexers 201 to 204 may be composed of a 4:2 MUX.

The first multiplexer 201 may generate first preliminary multiplexed data MX<1:2> by multiplexing first data, which is a part of the data D<0:15>, according to the control signal CTRL.

The second multiplexer 202 may generate second preliminary multiplexed data MX<3:4> by multiplexing second data, which is another part of the data D<0:15>, according to the control signal CTRL.

The third multiplexer 203 may generate third preliminary multiplexed data MX<5:6> by multiplexing third data, which is still another part of the data D<0:15>, according to the control signal CTRL.

The fourth multiplexer 204 may generate fourth preliminary multiplexed data MX<7:8> by multiplexing fourth data, which is yet another part of the data D<0:15>, according to the control signal CTRL.

The fifth multiplexer 205 may generate the multiplexed data MXOUT by multiplexing the first preliminary multiplexed data MX<1:2>, the second preliminary multiplexed data MX<3:4>, the third preliminary multiplexed data MX<5:6>, and the fourth preliminary multiplexed data MX<7:8> according to the external clock signal CLK.

The external clock signal CLK may have a frequency different from those of the internal clock signals POUT1B, POUT3, POUT3B, POUT2, and POUT2B included in the control signals CTRL.

The fifth multiplexer 205 may be composed of an 8:1 MUX.

Figure 4:
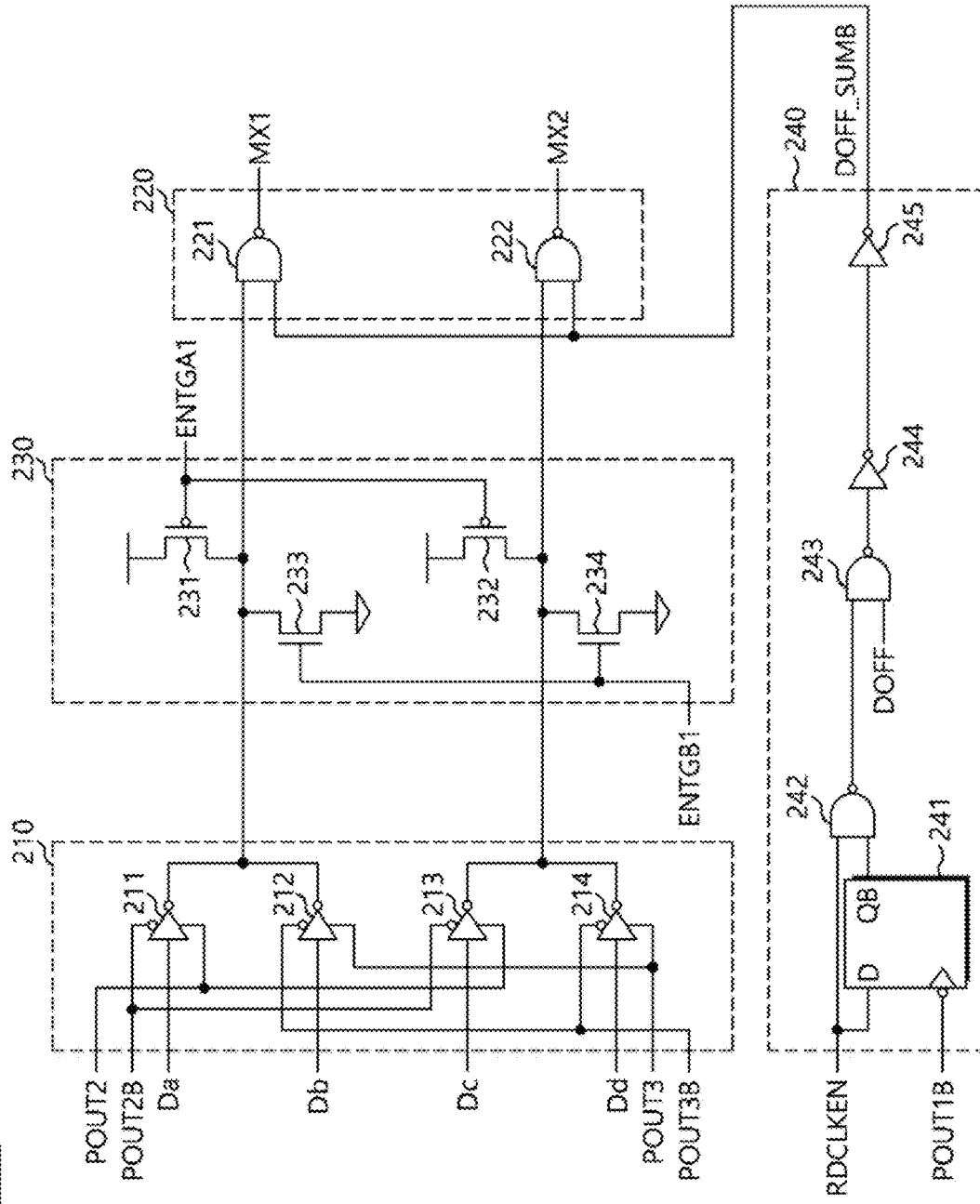
FIG. 4 is a diagram illustrating a configuration of a first multiplexer of FIG. 3.

FIG. 4 is a diagram illustrating a configuration of the first multiplexer 201 of FIG. 3.

Referring to FIG. 4, the first multiplexer 201 may include a multiplexing logic circuit 210, an output control logic circuit 220, a toggling pre-processing logic circuit 230, and a control signal generation logic circuit 240.

The multiplexing logic circuit 210 may selectively output the first data, for example, Da to Dd, according to the internal clock signals POUT3, POUT3B, POUT2, and POUT2B.

The multiplexing logic circuit 210 may include a plurality of logic gates, for example, first to fourth logic gates 211 to 214.

The first logic gate 211 may invert and output the data D1 in response to the rising edge of the internal clock signal POUT2.

The second logic gate 212 may invert and output the data D5 in response to the rising edge of the internal clock signal POUT3.

The third logic gate 213 may invert and output the data D3 in response to the rising edge of the internal clock signal POUT2.

The fourth logic gate 214 may invert and output the data D7 in response to the rising edge of the internal clock signal POUT3.

The output control logic circuit 220 may generate the first preliminary multiplexed data MX<1:2> in response to the output signals of the multiplexing logic circuit 210 and a corrected data output off signal DOFF_SUMB.

When the corrected data output off signal DOFF_SUMB is at a first level (for example, a low level), the output control logic circuit 220 may fix the level of the first preliminary multiplexed data MX<1:2> to a second level (for example, a high level) regardless of the levels of the output signals of the multiplexing logic circuit 210.

When the corrected data output off signal DOFF_SUMB is at a second level (for example, a high level), the output control logic circuit 220 may invert the output signals of the multiplexing logic circuit 210 and output the first preliminary multiplexed data MX<1:2>.

The output control logic circuit 220 may include a plurality of logic gates, for example, a first logic gate 221 and a second logic gate 222.

The first logic gate 221 may perform a NAND operation on one of the output signals of the multiplexing logic circuit 210 and the corrected data output off signal DOFF_SUMB, and output a NANDed signal.

The second logic gate 222 may perform a NAND operation on the other one of the output signals of the multiplexing logic circuit 210 and the corrected data output off signal DOFF_SUMB, and output a NANDed signal.

The toggling pre-processing logic circuit 230 may perform an operation of adjusting the levels of the input signals of the output control logic circuit 220 to match the pre-toggling operation according to the first pre-toggling control signals ENTGA1 and the ENTGB1.

The toggling pre-processing logic circuit 230 may change the input signals of the output control logic circuit 220 to a low level or a high level according to the first pre-toggling control signals ENTGA1 and the ENTGB1.

The toggling pre-processing logic circuit 230 may include a plurality of transistors, for example, first to fourth transistors 231 to 234.

The first transistor 231 has a source terminal connected to a power supply terminal, a drain terminal connected to one of the input signal lines of the output control logic circuit 220, that is, an input terminal of the first logic gate 221, and a gate terminal to which ENTGA1, which is one of the first pre-toggling control signals ENTGA1 and the ENTGB1, may be inputted.

The second transistor 232 has a source terminal connected to the power supply terminal, a drain terminal connected to another one of the input signal lines of the output control logic 220, that is, an input terminal of the second logic gate 222, and a gate terminal to which ENTGA1 may be inputted.

The third transistor 233 has a source terminal connected to a ground terminal, a drain terminal connected to one of the input signal lines of the output control logic circuit 220, and a gate terminal to which ENTGB1, which is one of the first pre-toggling control signals ENTGA1 and the ENTGB1, may be inputted.

The fourth transistor 234 has a source terminal connected to the ground terminal, a drain terminal connected to another one of the input signal lines of the output control logic circuit 220, and a gate terminal to which ENTGB1 may be inputted.

The control signal generation logic circuit 240 may generate the corrected data output off signal DOFF_SUMB in response to the clock enable signal RDCLKEN, the internal clock signal POUT1B, and the data output off signal DOFF.

The control signal generation logic circuit 240 may include a flip-flop 241 and first to fourth logic gates 242 to 245.

The flip-flop 241 may latch and output the rising edge of the clock enable signal RDCLKEN according to the falling edge of the internal clock signal POUT1B.

The first logic gate 242 may perform a NAND operation on the clock enable signal RDCLKEN and the output signal of the flip-flop 241, and output a NANDed signal.

The second logic gate 243 may perform a NAND operation on the output signal of the first logic gate 242 and the data output off signal DOFF, and output a NANDed signal.

The third logic gate 244 may invert and output the output signal of the second logic gate 243.

The fourth logic gate 245 may output the corrected data output off signal DOFF_SUMB by inverting the output signal of the third logic gate 244.

Figure 5:
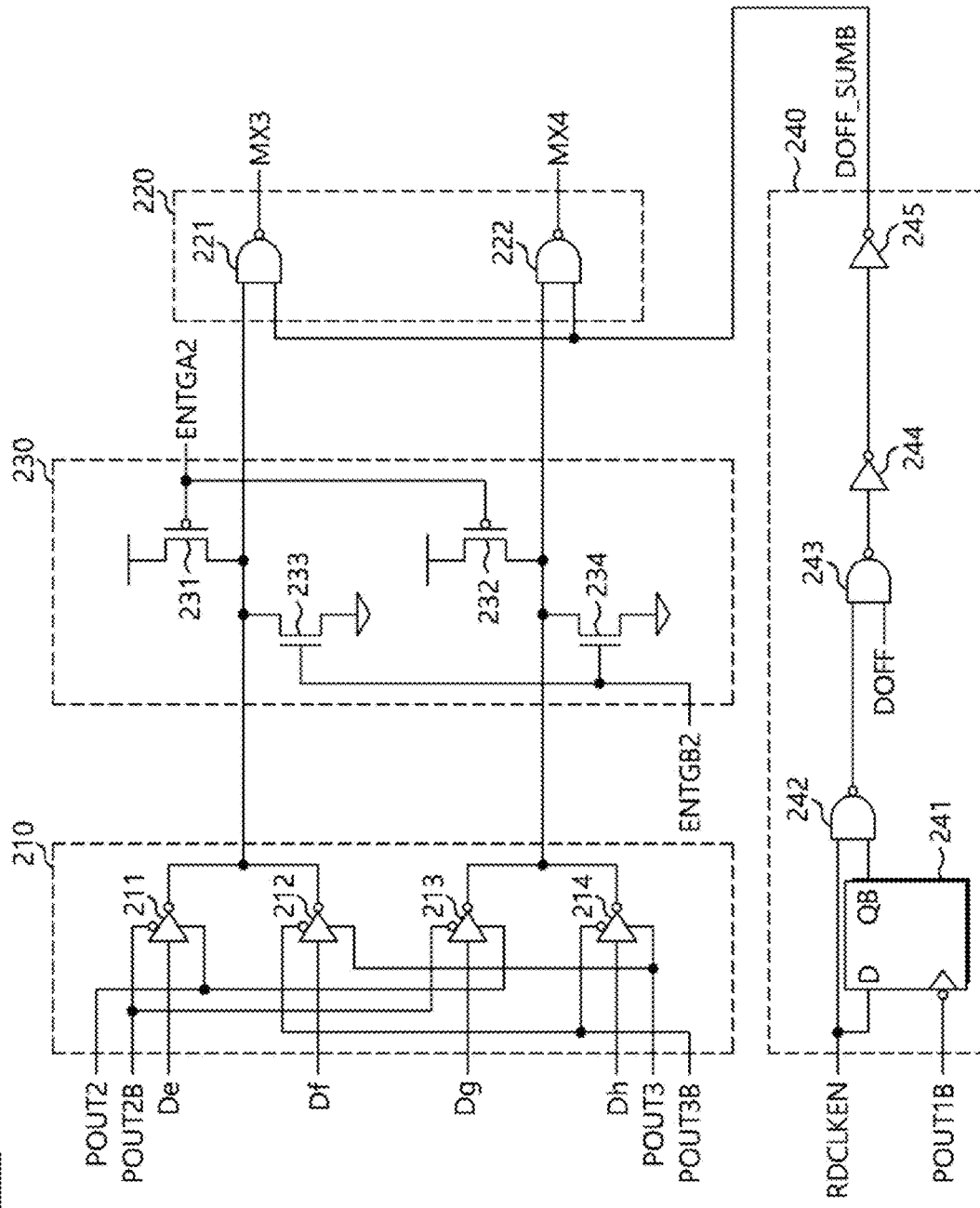
FIG. 5 is a diagram illustrating a configuration of a second multiplexer of FIG. 3.

FIG. 5 is a diagram illustrating a configuration of the second multiplexer 202 of FIG. 3.

Referring to FIG. 5, the second multiplexer 202 may be configured in the same manner as the first multiplexer 201 of FIG. 4, except for receiving second data, for example, De to Dh and the second pre-toggling control signals ENTGA2 and ENTGB2.

In the second multiplexer 202, ENTGA2, which is one of the second pre-toggling control signals ENTGA2 and the ENTGB2, may be inputted to a gate terminal of a first transistor 231 and a gate terminal of a second transistor 232, and ENTGB2, which is the other one of the second pre-toggling control signals ENTGA2 and ENTGB2, may be inputted to a gate terminal of a third transistor 233 and a gate terminal of a fourth transistor 234.

Although not illustrated in the drawing, the third multiplexer 203 may be configured in the same manner as the first multiplexer 201 of FIG. 4, except for receiving the third pre-toggling control signals ENTGA3 and ENTGB3.

In the third multiplexer 203, ENTGA3, which is one of the third pre-toggling control signals ENTGA3 and ENTGB3, may be inputted to a gate terminal of a first transistor 231 and a gate terminal of a second transistor 232, and ENTGB3, which is the other one of the third pre-toggling control signals ENTGA3 and ENTGB3, may be inputted to a gate terminal of a third transistor 233 and a gate terminal of a fourth transistor 234.

The fourth multiplexer 204 may be configured in the same manner as the first multiplexer 201 of FIG. 4, except for receiving the fourth pre-toggling control signals ENTGA4 and ENTGB4.

In the fourth multiplexer 204, ENTGA4, which is one of the fourth pre-toggling control signals ENTGA4 and ENTGB4, may be inputted to a gate terminal of a first transistor 231 and a gate terminal of a second transistor 232, and ENTGB4, which is the other one of the fourth pre-toggling control signals ENTGA4 and ENTGB4, may be inputted to a gate terminal of a third transistor 233 and a gate terminal of a fourth transistor 234.

Figure 6:
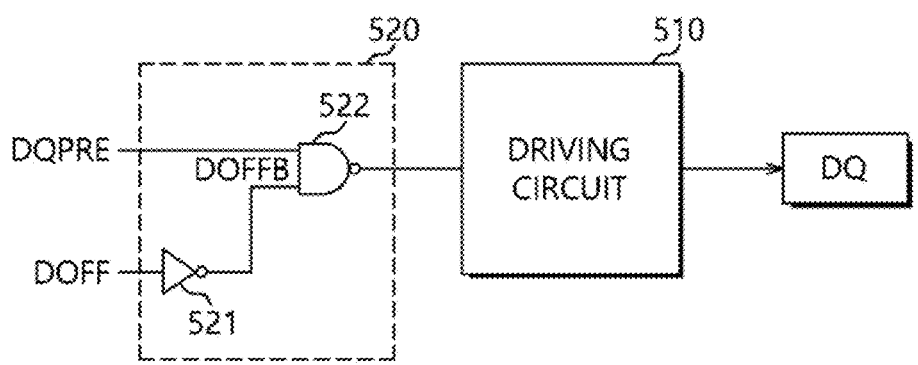
FIG. 6 is a diagram illustrating a configuration of a main driver of FIG. 2.

FIG. 6 is a diagram illustrating a configuration of the main driver 500 of FIG. 2.

Referring to FIG. 6, the main driver 500 may include a driving circuit 510 and an input control circuit 520.

The driving circuit 510 may drive the data input/output pads DQ at a power supply terminal level or a ground terminal level according to an input signal.

The input control circuit 520 may transfer the preliminary read data DQPRE to the driving circuit 510 according to the data output off signal DOFF.

When the data output off signal DOFF is at a first level (for example, a low level), the input control circuit 520 may invert the preliminary read data DQPRE and transfer inverted data to the driving circuit 510.

When the data output off signal DOFF is at a second level (for example, a high level), the input control circuit 520 may substantially maintain the level of its own output signal at a high level regardless of the level of the preliminary read data DQPRE.

As the output signal of the input control circuit 520 is substantially maintained at a high level, the level of the output signal of the driving circuit 510 is also fixed, so that data output through the data input/output pads DQ may be blocked.

The input control circuit 520 may include a first logic gate 521 and a second logic gate 522.

The first logic gate 521 may invert the data output off signal DOFF and output an inverted data output off signal DOFFB.

The second logic gate 522 may perform a NAND operation on the preliminary read data DQPRE and the inverted data output off signal DOFFB, and output a NANDed signal.

Figure 7:
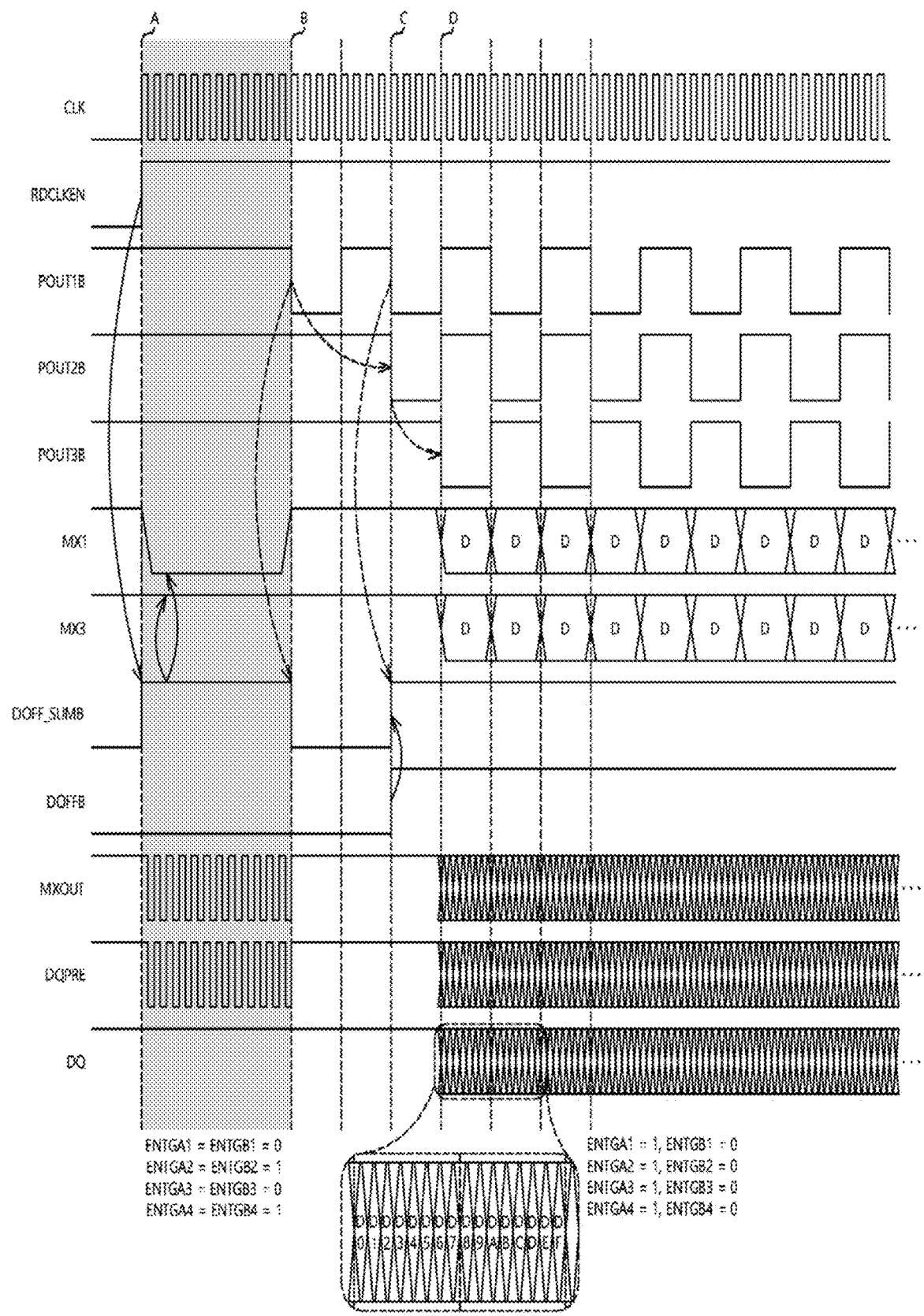
FIG. 7 is a diagram for explaining a pre-toggling implementation method in accordance with an embodiment.

FIG. 7 is a diagram for explaining the pre-toggling implementation method in accordance with the embodiment.

With reference to FIG. 1 to FIG. 7, the pre-toggling implementation method of the embodiment will be described.

When a read command is inputted, the clock enable signal RDCLKEN for activating the internal clock signals POUT1B, POUT3, POUT3B, POUT2, and POUT2B required for data output may be activated to a high level at a first time point A.

The read command may be inputted through the command and address pads C/A of FIG. 1 and decoded by the control circuit 30.

The data output off signal DOFF may be substantially maintained at a high level such that data output through the data input/output pads DQ is blocked from the first time point A to a second time point B. The inverted data output off signal DOFFB may be substantially maintained at a low level.

Because the internal clock signals POUT1B, POUT3, POUT3B, POUT2, and POUT2B required for data output are not activated from the first time point A to the second time point B, the data output through the data input/output pads DQ, that is, voltage level variations in the data input/output pads DQ need to be blocked.

Referring to FIG. 5, the level of the output signal of the driving circuit 510 is fixed up to a third time point C, that is, during an interval in which the inverted data output off signal DOFFB is at a low level, so that the voltage levels of the data input/output pads DQ may be fixed.

The corrected data output off signal DOFF_SUMB changes to a high level as the clock enable signal RDCLKEN is activated to a high level at the first time point A, and changes to a low level as the internal clock signal POUT1B changes to a low level at the second time point B (see FIG. 4).

From the first time point A to the second time point B, all of the first pre-toggling control signals ENTGA1 and ENTGB1 may be substantially maintained at a low level, all of the second pre-toggling control signals ENTGA2 and ENTGB2 may be substantially maintained at a high level, all of the third pre-toggling control signals ENTGA3 and ENTGB3 may be substantially maintained at a low level, and all of the fourth pre-toggling control signals ENTGA4 and ENTGB4 may be substantially maintained at a high level.

The levels of the first to fourth pre-toggling control signals ENTGA<1:4> and the ENTGB<1:4> may be set by the mode register set.

Because the ENTGA1, the ENTGB1, the ENTGA3, and the ENTGB3 are at a low level, the ENTGA2, the ENTGB2, the ENTGA4, and the ENTGB4 are at a high level, and the corrected data output off signal DOFF_SUMB is at a high level, the MX<1, 2, 5, and 6> of the first to fourth preliminary multiplexed data MX<1:8> may change to a low level and the MX<3, 4, 7, and 8> thereof may change to a high level.

The fifth multiplexer 205 of FIG. 3 may select the first to fourth preliminary multiplexed data MX<1:8> in a predetermined order based on the external clock signal CLK, for example, in the order of MX1, MX3, MX5, MX7, MX2, MX4, MX6, and MX8, and output the multiplexed data MXOUT.

Because the MX1, the MX3, the MX5, the MX7, the MX2, the MX4, the MX6, and the MX8 are sequentially selected, the multiplexed data MXOUT has a pre-toggling interval between the first time point A and the second time point B.

FIG. 7 illustrates only the pre-toggling of a pattern of repeating low-high levels, and pre-toggling of a pattern of repeating high-low levels is also possible by changing the values of the first to fourth pre-toggling control signals ENTGA<1:4> and the ENTGB<1:4>.

The pre-driver 300 of FIG. 2 may generate the preliminary read data DQPRE by driving the multiplexed data MXOUT.

Because the multiplexed data MXOUT has a pre-toggling interval between the first time point A and the second time point B, the preliminary read data DQPRE also has a pre-toggling interval between the first time point A and the second time point B.

The voltage level of the data output path 41 may be stabilized by the pre-toggling operation of the preliminary read data DQPRE.

At the second time point B, the ENTGA<1:4> may change to a high level and the ENTGB<1:4> may change to a low level according to the setting of the mode register set.

The internal clock signal POUT1B may be activated, that is, the transition of the internal clock signal POUT1B may be started.

As the internal clock signal POUT1B changes to a low level, the corrected data output off signal DOFF_SUMB may change to a low level.

At the third time point C after a predetermined time from the second time point B, the internal clock signal POUT2B may change to a low level.

Meanwhile, because the inverted data output off signal DOFFB is substantially maintained at a low level up to the third time point C, the data input/output pads DQ are substantially maintained at a predetermined level, for example, a high level, so that read data output may be blocked.

As the inverted data output off signal DOFFB changes to a high level at the third time point C, that is, the data output off signal DOFF changes to a low level, the corrected data output off signal DOFF_SUMB changes to a high level (see FIG. 4).

As the internal clock signal POUT3B changes to a low level at a fourth time point D, data output through the data input/output pads DQ may be performed.

The data output through the data input/output pads DQ may be performed in 16 bit units D0, D1, D2, D3, D4, D5, D6, D7, D8, D9, Da, Db, Dc, Dd, De, and Df based on one cycle of the internal clock signal, for example, POUT3B.

Because the instability of the voltage level of the data output path 41 is solved by the pre-toggling operation of the preliminary read data DQPRE, the data output through the data input/output pads DQ at the fourth time point D may also be stably performed.

While various embodiments have been described above, it will be understood to those skilled in the art that the embodiments described are examples only. Accordingly, the output control circuit and the semiconductor apparatus including the same described herein should not be limited based on the described embodiments.

What is claimed is:

1. A semiconductor apparatus comprising:
   a data output path connected to a data input/output pad and configured to be input a data and output read data according to a read command,
   wherein at least one circuit configuration included in the data output path is configured to perform a pre-toggling operation of toggling the data at least once in an interval between a time point at which the read command has been generated and a time point at which the read data is outputted through the data output path,
   wherein a voltage level of the data input/output pad has been fixed during the interval.

2. The semiconductor apparatus according to claim 1, wherein the pre-toggling operation is performed in one of a pattern of repeating low-high levels and a pattern of repeating high-low levels.

3. The semiconductor apparatus according to claim 1, wherein the data output path comprises:
   a multiplexing circuit configured to generate multiplexed data by multiplexing data and configured to perform the pre-toggling operation on the multiplexed data.

4. The semiconductor apparatus according to claim 3, further comprises:
   a pre-driver configured to generate preliminary read data by driving the multiplexed data; and
   a main driver configured to drive the preliminary read data and output the preliminary read data to the data input/output pad,
   wherein the data output path is configured to perform the pre-toggling operation on the multiplexed data and the preliminary read data.

5. The semiconductor apparatus according to claim 3, wherein the multiplexing circuit comprises:
   a plurality of preliminary multiplexers configured to generate a plurality of preliminary multiplexed data by multiplexing some data bits of the data, which are inputted to the plurality of preliminary multiplexers; and
   a main multiplexer configured to multiplex and output of the plurality of preliminary multiplexers,
   wherein the main multiplexer is configured to perform the pre-toggling operation.

6. An output control circuit comprising:
   a data input/output pad; and
   a data output path connected to the data input/output pad and configured to be input a data and output read data,
   wherein the output control circuit is configured to perform a pre-toggling operation of toggling the data of at least one of circuit configurations of the data output path at a time before data output through the data input/output pad is performed, in a state in which a voltage level of the data input/output pad has been fixed.

7. The output control circuit according to claim 6, wherein the pre-toggling operation is performed in one of a pattern where a level of the output signal of the at least one circuit configuration repeats low-high levels and a pattern where the level of the output signal of the at least one circuit configuration repeats high-low levels.

8. The output control circuit according to claim 6, wherein the data output path comprises:
   a multiplexing circuit configured to generate multiplexed data by multiplexing data and configured to perform the pre-toggling operation on the multiplexed data.

9. The output control circuit according to claim 8, further comprises:
   a pre-driver configured to generate preliminary read data by driving the multiplexed data; and
   a main driver configured to drive the preliminary read data and output the preliminary read data to the data input/output pad,
   wherein the data output path is configured to perform the pre-toggling operation on the multiplexed data and the preliminary read data.

10. The output control circuit according to claim 8, wherein the multiplexing circuit comprises:

a plurality of preliminary multiplexers configured to generate a plurality of preliminary multiplexed data by multiplexing some data bits of the data, which are inputted to the plurality of preliminary multiplexers; and a main multiplexer configured to multiplex and output of the plurality of preliminary multiplexers, wherein the main multiplexer is configured to perform the pre-toggling operation.

11. The output control circuit according to claim 10, wherein the preliminary multiplexer comprises:

a multiplexing logic circuit configured to selectively output the some data bits according to an internal clock signal;

an output control logic circuit configured to generate preliminary multiplexed data in response to an output signal of the multiplexing logic circuit and a corrected data output off signal;

a toggling pre-processing logic circuit configured to adjust levels of input signals of the output control logic circuit to match the pre-toggling operation according to a pre-toggling control signal; and a control signal generation logic circuit configured to generate the corrected data output off signal in response to a clock enable signal, the internal clock signal, and a data output off signal.

12. A semiconductor apparatus comprising:

a main driver configured to output read data, which is generated by driving an input signal, to a data input/output pad and to fix a voltage level of the read data according to a data output off signal; and a multiplexing circuit configured to multiplex data to provide multiplexed data as the input signal of the main driver, and to perform a pre-toggling operation on the multiplexed data according to a corrected data output off signal generated according to the data output off signal, wherein the pre-toggling operation is an operation of toggling the multiplexed data at least once in an interval between a time point at which a read command has been generated and a time point at which the read data is outputted, wherein a voltage level of the data input/output pad has been fixed during the interval.

13. The semiconductor apparatus according to claim 12, further comprising:

a pre-driver configured to drive an output signal of the multiplexing circuit to provide the output signal to the main driver.

14. The semiconductor apparatus according to claim 12, wherein the pre-toggling operation is performed in one of a pattern of repeating low-high levels and a pattern of repeating high-low levels.

15. The semiconductor apparatus according to claim 12, wherein the main driver comprises:

a driving circuit configured to drive the data input/output pad at a power supply terminal level or a ground terminal level according to the input signal; and an input control circuit configured to transfer the input signal to the driving circuit according to the data output off signal.

16. The semiconductor apparatus according to claim 12, wherein the multiplexing circuit comprises:

a plurality of preliminary multiplexers configured to generate a plurality of preliminary multiplexed data by multiplexing some data bits of the data, which are inputted to the plurality of preliminary multiplexers; and a main multiplexer configured to multiplex and output of the plurality of preliminary multiplexers.

17. The semiconductor apparatus according to claim 16, wherein the preliminary multiplexer comprises:

a multiplexing logic circuit configured to selectively output the some data bits according to an internal clock signal;

an output control logic circuit configured to generate preliminary multiplexed data in response to an output signal of the multiplexing logic circuit and the corrected data output off signal;

a toggling pre-processing logic circuit configured to adjust levels of input signals of the output control logic circuit to match the pre-toggling operation according to a pre-toggling control signal; and a control signal generation logic circuit configured to generate the corrected data output off signal in response to a clock enable signal, the internal clock signal, and the data output off signal.

* * * * *